United States Patent [19]
Iizuka et al.

[11] 3,742,315
[45] June 26, 1973

[54] SCHOTTKY BARRIER TYPE SEMICONDUCTOR DEVICE WITH IMPROVED BACKWARD BREAKDOWN VOLTAGE CHARACTERISTIC

[75] Inventors: Mutsuo Iizuka, Osaka; Shohei Fujiwara, Takatsuki; Gota Kano, Kyoto; Hiromasa Hasegawa, Takatsuki; Iwao Teramoto, Ibaragi; Hitoo Iwasa, Takatsuki, all of Japan

[73] Assignee: Matsushita Electronics Corporation, Osaka, Japan

[22] Filed: Oct. 18, 1971

[21] Appl. No.: 189,931

Related U.S. Application Data

[62] Division of Ser. No. 861,670, Sept. 29, 1969.

[30] Foreign Application Priority Data

Dec. 30, 1969 Japan ........................... 44/72668

[52] U.S. Cl. ........... 317/234 R, 156/17, 317/234 N, 317/235 UA, 317/235 AJ
[51] Int. Cl. .......... H01l 5/02, H01l 7/50, H01l 7/60
[58] Field of Search ................ 317/235 UA, 235 AS

[56] References Cited

UNITED STATES PATENTS

| | | | |
|---|---|---|---|
| 3,550,260 | 12/1970 | Saltich et al. | 317/235 UA |
| 3,447,235 | 6/1969 | Rosvold et al. | 317/235 AS |
| 3,575,731 | 4/1971 | Hoshi et al. | 317/235 AS |
| 3,570,001 | 3/1971 | Van Papendrecht et al. | 317/235 AS |

*Primary Examiner*—John W. Huckert
*Assistant Examiner*—William D. Larkins
*Attorney*—Stevens, Davis, Miller & Mosher

[57] ABSTRACT

A semiconductor device having a Schottky barrier junction formed in the bottom of a polygonal recess on a surface of a semiconductor substrate comprises an undercut in the recess beneath an insulating mask formed on the substrate, and a metal passing through the mask and extending to the bottom of the recess for forming said junction. The undercut provides an enclosed spacing encircling the junction portion of said metal and said semiconductor, thereby improving the backward breakdown voltage characteristic therein.

2 Claims, 13 Drawing Figures

SCHOTTKY BARRIER TYPE SEMICONDUCTOR DEVICE WITH IMPROVED BACKWARD BREAKDOWN VOLTAGE CHARACTERISTIC

CROSS REFERENCE TO THE RELATED APPLICATION

This application is a divisional application of U.S. Ser. No. 861670 filed on Sept. 29, 1969.

BACKGROUND OF THE INVENTION

FIELD OF THE INVENTION

The present invention relates to a semiconductor device, and more particularly, to Schottky barrier type semiconductor device whose backward breakdown voltage characteristic is improved.

DESCRIPTION OF THE PRIOR ART

Figure 1:
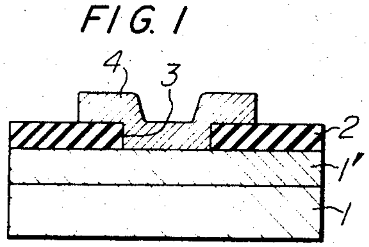
FIG. 1 is a sectional view showing an example of a prior art Schottky barrier type semiconductor device.

FIG. 1 shows a Schottky barrier type semiconductor device of conventional type. This diode has a so-called planar structure in which, after forming an insulating film 2, such as a silicon oxide film, on the surface of a silicon substrate 1 having an n-type epitaxial growth layer 1′ on its surface portion, a window 3 is made in the oxide film, then a predetermined metal film 4, such as molybdenum film, is applied to window 3.

However, a device having this structure has a disadvantage in that the backward breakdown voltage of the rectifying junction is lower than the expected value. That is, when a diode is constructed as a device having the above structure using a silicon substrate with an epitaxial growth layer 1′ having a resistivity of 0.5 Ω-cm and a thickness of 1 μ and applying a molybdenum film 4, about 20 volts are predicted as the theoretical breakdown voltage, but the breakdown voltage of the actually obtained device has such a low value as about 5–10 volts.

Figure 2:
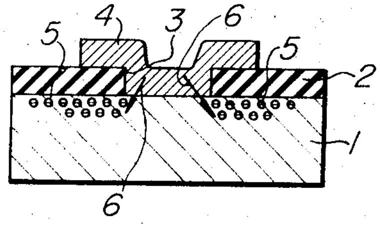
FIG. 2 is a view illustrating the principle of the device shown in FIG. 1.

The reasons for this lowering of the backward breakdown voltage is considered to be that, as is illustrated in FIG. 2, with the result of the phenomenon of accumulating an electric charge 5 at the surface portion of the silicon substrate under the silicon oxide film 2, a leakage current is produced from the metal electrode 2 to said electric charge accumulating portion 5 in the direction indicated by an arrow 6; thus the backward breakdown voltage is lowered.

Though it has been proposed to provide a diffused region called a guard-ring for isolating the charged layer on the substrate encircling the junction portion of said metal and semiconductor in order to lower this leakage current, the process for manufacturing this device becomes complex and therefore is not of practical use.

SUMMARY OF THE INVENTION

The general object of the present invention is to provide a novel Schottky barrier type semiconductor device whose structure can improve the backward breakdown voltage at barrier junction thereof.

Another object of the present invention is to provide a novel Schottky barrier type semiconductor device which is easy to manufacture and has high reliability.

Other objects, features and advantages of the present invention will become apparent from the following detailed description of the preferred embodiments of this invention when taken in conjunction with the accompanying drawings.

DESCRIPTION OF THE PREFERRED EMBODIMENT

A Schottky barrier type semiconductor device showing an embodiment of the present invention is described with reference to FIG. 3, in which after forming an insulating film 12 on a semiconductor substrate 11, a window 13 is perforated to the insulating film 12 by means of a known photo-etching method. After that, the exposed semiconductor surface is etched by a chemical solution through the window 13. In the process of this chemical etching, the said semiconductor body is etched not only in the axial direction of said window 13, but also in its circumferential direction. Then a recess 14 having a dimension slightly larger than said window is formed at the surface portion of the semiconductor body under the periphery of the window 13 in said insulating film 12. In this state, a metal such as molybdenum 15 which forms a rectifying barrier in contact with the semiconductor substrate is evaporated from the axial direction of the window 13 to form a junction at the flat portion of the recess 14 in said semiconductor body. The semiconductor device having the construction thus formed is characterized by having a vacant space 16 which is formed with the result that the semiconductor under the periphery of the window 13 in said insulating film 12 is eliminated by this etching process. According to the experience of the inventors, the backward breakdown characteristic is thus improved when the recess 14 in the semiconductor body has a depth in the axial direction of the window 13 of more than 500 A and a distance of more than 1,000 A in the direction perpendicular to said axial direction from the periphery of the window 13. It is effective for improving the stability of the semiconductor device to make the thickness of the metal film 15 thicker than the depth of recess 14, and to form the electrode by covering the window portion in the insulating film with the metal film.

Figure 3:
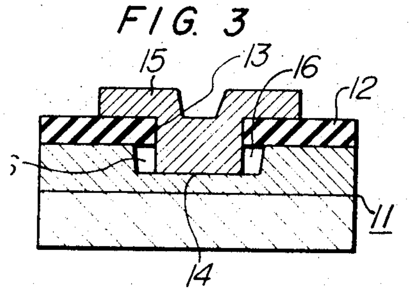
FIG. 3 is a sectional view of an embodiment of a semiconductor device according to the present invention.

Though it is desirable to select such an etching solution that the etching rate in the direction perpendicular to the sliced surface is lower than that in the other direction, especially in the lateral direction, it is very difficult to form uniformly the vacant space 16 shown in FIG. 3 since an etching solution has generally a different etching rate depending upon the direction of each crystallographic surface, even in the lateral direction.

In view of this, an attempt has been made in the present invention to provide the vacant space shown in FIG. 3 uniformly all around the periphery of the junction with good reproducibility and controllability by determining the shape of the junction window and the direction of fitting a mask, taking into account the dependency of the etching rate upon the crystallographic surface.

When a semiconductor body is etched, it is well known that the etching rate largely depends not only upon the kind of etching solution used, but also the crystallographic surface.

For example, an etching solution consisting of 8 ml of water, 17 ml of ethylenediamine and 3 g of pyrocatechol has an etching rate ratio of 3:30:50 in the direction of crystallographic surface (111), (110) and (100) respectively for Si, the dependence of the etching rate upon the crystallographic surface being known to be very large.

Here, we used an etching solution having a relatively large dependence of etching rate upon the crystallographic surface and a silicon slice of which the crystal crystallographic axis is in the direction <111>, the etching rate being generally lower in that direction, in order to form the vacant space 16 shown in FIG. 3 in such a way as described above that the depth is relatively shallow and is uniform all around the periphery of the junction window.

Figures 4A, 4B, 5A, 5B, 6A, 6B, 7A, 7B, 7C:
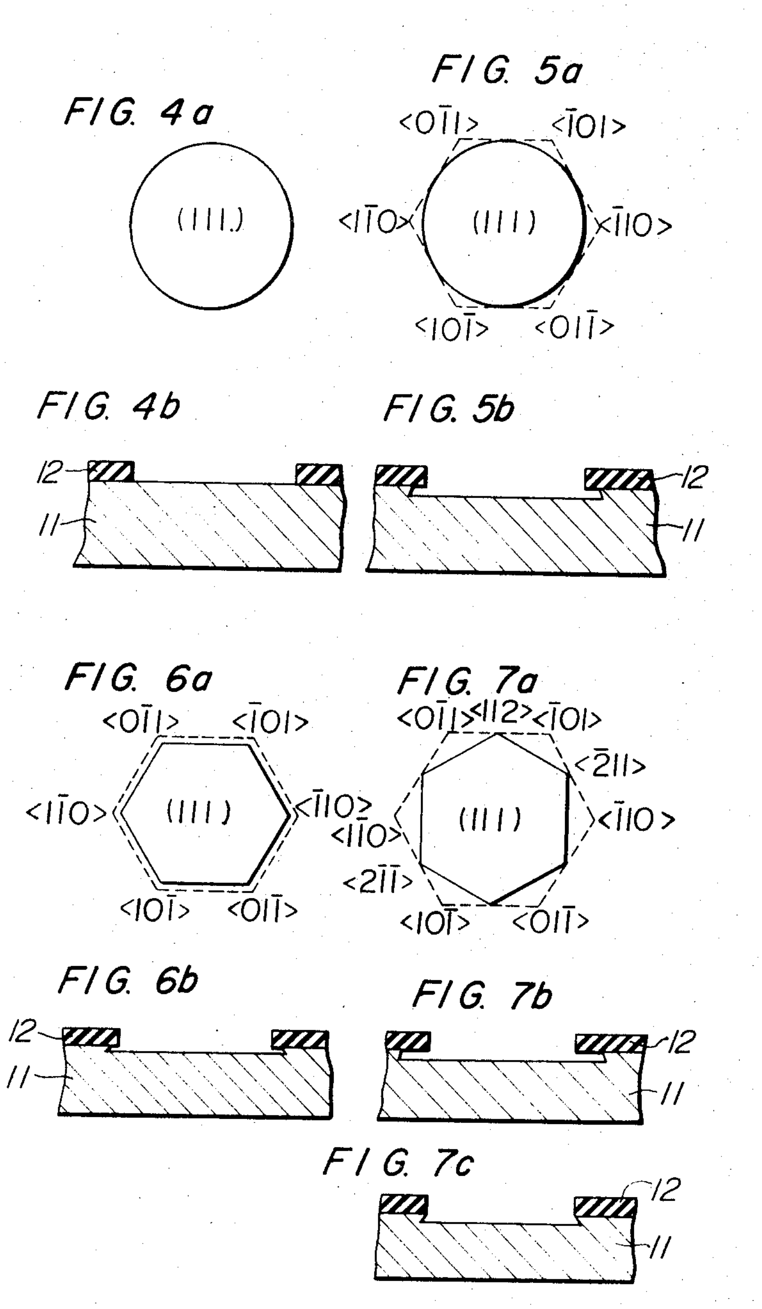
FIGS. 4*a*, 4*b*, 5*a*, 5*b*, 6*a*, 6*b*, 7*a*, 7*b* and 7*c* are views for illustrating the steps of manufacturing the device of the present invention.

For example, as in the prior art, when an oxide film of about 5,000 A thick is formed on a silicon slice of which the crystallographic axis is in the direction <111>, a circular window as shown in FIG. 4 is opened by the photo-etching method and the silicon surface is etched by said etching solution (water 8 ml, ethylenediamine 17 ml and pyrocatechol 3 g); as a result, the etched recess has the shape of a nearly regular hexagon as shown in FIG. 5.

Paying attention to this directional dependence, when a window is opened in the same direction of the regular hexagon as shown in FIG. 5 with respect to the crystallographically hexagonal pattern and the silicon is etched similarly, it is found that silicon is etched in a shape as shown in FIG. 6. Similarly, when the hexagonal window is shifted by 30° with respect to the above-mentioned pattern, silicon is etched as shown by a dotted hexagon in FIG. 7.

It can be seen from FIG. 6 that the etching can be uniformly carried out in the lateral direction all around the junction window to the silicon of which the crystallographic axis is in the direction <111> by adjusting the direction of one side of a triangular or a hexagonal window in parallel with the direction <1$\bar{1}$0> or <$\bar{1}$10>.

On the other hand, in case the shape of the window or the directional dependence of the etching rate is not taken into account, some laterally over-etched portions are partly formed in providing the minimum effective vacant space all around the window, since the etching proceeds non-uniformly in the lateral direction, as undesirable examples shown in FIG. 7, so that the mechanically protective strength of the oxide film forming the vacant space becomes a problem and there is a defect in that the vacant space is broken in the manufacturing process of the diode.

As has been described above, since the vacant space 16 can be formed uniformly and effectively by determining the shape of the window and the direction of it, the reproducibility of the current to voltage characteristic and the controllability of the uniformity are substantially improved, permitting elimination of the leakage current even where the depth of the recess is relatively shallow (1,000–2,000 A) compared with the conventional method. Thus the non-uniformity of electrical characteristics of the diode, which is often caused by the over-digging of the recess, could have been made very small.

Now, an example of the present invention will be described below.

After forming an oxide film of 5,000 A thickness on a silicon substrate which is prepared by epitaxially growing an n-type resistive layer having a high resistivity of about 0.5 Ωcm on a silicon body having an n-type high impurity concentration (more than $10^{19}/cm^3$) and the crystallographic axis of in the direction <111>, therefore a regular hexagonal window one side of which is 15 μ in length was opened in the oxide film by the photo-etching technique in such a way that one side of it becomes parallel with the direction of the crystallographic axis <$\bar{1}$10> or <1$\bar{1}$0>. Then, the portion of the silicon substrate exposed through said window was etched to a thickness of about 1,000 A in the direction of depth by means of an etching solution having a relative low etching rate in that direction <111>. In this process, the etching depth in a lateral direction from the peripheral edge of said window in the insulating film, that is, the side etched length or lateral width was about 2,000 A. In the next, after evaporating molybdenum in a thickness of about 3,000 A through said window a gold film was evaporated on the molybdenum in a thickness of about 5,000 A, and then a regular hexagonal electrode with one side of 50 μ was formed centering around said window portion. Additionally, an ohmic contact was formed on the back surface of the silicon substrate by evaporating gold including 1 percent of antimony to which an external electrode wire was connected. Thus, a Schottky barrier type diode comprising a molybdenum-silicon junction was formed.

Figure 8:
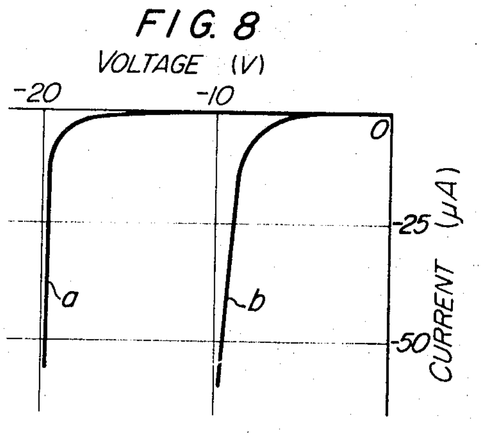
FIG. 8 is a characteristic diagram illustrating the effectiveness of the present invention.

The backward voltage to current characteristics of the diode according to this embodiment are shown in FIG. 8, where the curve *a* represents the characteristic of a Schottky barrier type diode of the present invention which has a window in a regular hexagonal pattern the direction of which is set as described above according to the embodiment of the present invention, and *b* represents the characteristic of a Schottky barrier type diode with the same structure having a circular window. As can be seen from the figure, the backward breakdown voltage of the device according to the present invention is high and its non-uniformity is very small compared with a device prepared according to conventional methods.

As has been described above, the semiconductor device according to the present invention has a good reproducibility and controllability in that the leakage current at the junction edge portion was eliminated, and the yield rate was substantially increased.

The guard space of the present invention can be manufactured by the chemical etching technique, the manufacturing method is easy and the cost is low. Moreover, the adjustment of the direction of the pattern can be made easily by forming an etched pit at a portion of the backward surface or slice surface, or a slice of which the direction is indicated by a cut can be also utilized.

We claim:

1. A semiconductor device having a Schottky barrier junction, comprising:

a semiconductor single crystal substrate;

a polygonally-shaped recess formed through a polygonally-shaped window of an insulating mask on said substrate, said recess having an undercut formed beneath the overlap of the window portion of the insulating mask and having a substantially uniform depth on all sides around the recess, said insulating mask being formed on a <111> plane surface of the semiconductor substrate, each side of said window being oriented parallel to a line of intersection of the <111> surface with the side of the recess corresponding to the side of the window, said lines of intersection and sides of the window each being oriented parallel to a <1$\bar{1}$0> axis lying in the <111> plane; and a predetermined metal provided on the bottom surface of said recess to form said Schottky barrier junction and extending outwardly towards said window portion;

said undercut forming a vacant insulating space defined by the bottom wall, by a side wall of the semiconductor substrate, by a side wall of the extending metal and by the overlap of the insulating mask.

2. The semiconductor device according to claim 1, wherein said semiconductor substrate comprises silicon and said insulating mask comprises silicon dioxide.

* * * * *